US012813128B2

(12) United States Patent
Gu et al.

(10) Patent No.: US 12,813,128 B2
(45) Date of Patent: Nov. 24, 2026

(54) LIGHT-EMITTING PANEL AND LIGHT-EMITTING DEVICE

(71) Applicant: BOE Technology Group Co., Ltd., Beijing (CN)

(72) Inventors: Penghao Gu, Beijing (CN); Hui Zhao, Beijing (CN); Guanqin Chen, Beijing (CN); Xiaojin Zhang, Beijing (CN); Jianchao Zhu, Beijing (CN); Song Zhang, Beijing (CN)

(73) Assignee: BOE TECHNOLOGY GROUP CO., LTD., Beijing (CN)

( * ) Notice: Subject to any disclaimer, the term of this patent is extended or adjusted under 35 U.S.C. 154(b) by 455 days.

(21) Appl. No.: 18/287,692

(22) PCT Filed: Nov. 19, 2021

(86) PCT No.: PCT/CN2021/131711

§ 371 (c)(1),
(2) Date: Oct. 20, 2023

(87) PCT Pub. No.: WO2022/222460

PCT Pub. Date: Oct. 27, 2022

(65) Prior Publication Data

US 2024/0188377 A1 Jun. 6, 2024

(30) Foreign Application Priority Data

Apr. 23, 2021 (CN) ......................... 202110441129.6

(51) Int. Cl.
*H10K 59/80* (2023.01)
*H10K 59/131* (2023.01)

(52) U.S. Cl.
CPC ......... *H10K 59/805* (2023.02); *H10K 59/131* (2023.02); *H10K 59/8722* (2023.02); *H10K 59/873* (2023.02)

(58) Field of Classification Search
CPC ............... H10K 59/805; H10K 59/131; H10K 59/8722; H10K 59/873
(Continued)

(56) References Cited

U.S. PATENT DOCUMENTS

2008/0042558 A1 2/2008 Buchhauser et al.
2014/0327356 A1* 11/2014 Nakai .................... H01L 24/24 315/34
(Continued)

FOREIGN PATENT DOCUMENTS

CN 103348766 A 10/2013
CN 204905259 U 12/2015
(Continued)

OTHER PUBLICATIONS

International Search Report and Written Opinion mailed on Feb. 23, 2022, in corresponding PCT/CN2021/131711, 6 pages.
(Continued)

*Primary Examiner* — Tu-Tu V Ho
(74) *Attorney, Agent, or Firm* — XSENSUS LLP

(57) ABSTRACT

The present invention relates to the technical field of illumination. Disclosed are a light-emitting panel and a light-emitting device. The light-emitting panel comprises a base substrate, a conductive coil, a first electrode, a light-emitting layer, and a second electrode; the base substrate has a first surface and a second surface which are disposed opposite to each other; the conductive coil is disposed on the first surface of the base substrate, and the conductive coil has a first end and a second end; the first electrode is connected to the first end; the light-emitting layer is disposed on the side of the first electrode away from the base substrate; the second electrode is disposed on the side of the light-emitting layer away from the base substrate, and the second electrode is connected to the second end.

18 Claims, 6 Drawing Sheets

(58) Field of Classification Search
USPC .......................................................... 257/40
See application file for complete search history.

(56) References Cited

U.S. PATENT DOCUMENTS

| | | | | |
|---|---|---|---|---|
| 2016/0190509 A1* | 6/2016 | Sato | H10K 50/13 | |
| | | | 257/40 | |
| 2022/0006051 A1* | 1/2022 | Takahashi | H05B 33/06 | |
| 2022/0320474 A1* | 10/2022 | Shin | H10K 59/878 | |

FOREIGN PATENT DOCUMENTS

| | | | |
|---|---|---|---|
| CN | 206250195 | U | 6/2017 |
| CN | 108388037 | A | 8/2018 |
| CN | 109378337 | A | 2/2019 |
| CN | 109696992 | A | 4/2019 |
| CN | 209526087 | U | 10/2019 |
| CN | 110459566 | A | 11/2019 |
| CN | 113178534 | A | 7/2021 |
| JP | 2000-164364 | A | 6/2000 |
| KR | 2020-0117400 | A | 10/2020 |

OTHER PUBLICATIONS

Office Action issued on Aug. 1, 2022, in corresponding Chinese patent Application No. 202110441129.6, 16 pages.
Notice of Allowance issued on Apr. 15, 2023, in corresponding Chinese patent Application No. 202110441129.6, 6 pages.

* cited by examiner

LIGHT-EMITTING PANEL AND LIGHT-EMITTING DEVICE

CROSS-REFERENCE TO RELATED APPLICATIONS

The present application is based upon International Application No. PCT/CN2021/131711, filed on Nov. 19, 2021, which is based upon and claims priority to Chinese Patent Application No. 202110441129.6, filed on Apr. 23, 2021, and titled "LIGHT-EMITTING PANEL AND LIGHT-EMITTING DEVICE", and the entire contents thereof are incorporated herein by reference.

TECHNICAL FIELD

The present disclosure relates to the field of lighting technology, and specifically, to a light-emitting panel and a light-emitting device including the light-emitting panel.

BACKGROUND

With the development of science and technology, Organic Light-Emitting Display (OLED) has gradually become the first choice for screens. It has many advantages such as self-illumination, high luminous efficiency, short response time, high clarity and contrast, and it can also ensure that the screen has certain flexibility and adaptability. People's demand for organic light-emitting diode products is getting higher and higher.

It should be noted that, information disclosed in the above background portion is provided only for better understanding of the background of the present disclosure, and thus it may contain information that does not form the prior art known by those ordinary skilled in the art.

SUMMARY

The present disclosure provides a light-emitting panel and a light-emitting device including the light-emitting panel.

According to one aspect of the present disclosure, a light-emitting panel is provided, including:

- a base substrate having a first surface and a second surface disposed oppositely;
- a conductive coil disposed on the first surface of the base substrate, the conductive coil having a first end and a second end;
- a first electrode connected to the first end;
- a light-emitting layer disposed on a side of the first electrode away from the base substrate; and
- a second electrode disposed on a side of the light-emitting layer away from the base substrate, and the second electrode being connected to the second end.

In an exemplary embodiment of the present disclosure, the first electrode is disposed on a side of the conductive coil away from the base substrate, or the first electrode is disposed in a same layer with a same material as the conductive coil.

In an exemplary embodiment of the present disclosure, the light-emitting panel further includes:

- a connecting electrode, disposed in a same layer with a same material as the first electrode, and insulated from the first electrode, wherein the second electrode is connected to the second end through the connecting electrode.

In an exemplary embodiment of the present disclosure, the light-emitting panel further includes:

- a magnetic conductive sheet, disposed on the second surface of the base substrate.

In an exemplary embodiment of the present disclosure, the light-emitting panel further includes:

- a barrier structure, disposed around a periphery of the conductive coil, and a vertical distance between a surface of the barrier structure away from the base substrate and the base substrate is greater than or equal to a vertical distance between a surface of the second electrode away from the base substrate and the base substrate.

In an exemplary embodiment of the present disclosure, the light-emitting panel further includes:

- a first planarization layer, disposed between the conductive coil and the first electrode: and
- a second planarization layer, disposed on sides of the first planarization layer and the first electrode away from the base substrate, wherein a third via hole is disposed on the second planarization layer, the third via hole is penetrated to the first electrode, and the light-emitting layer and the second electrode are disposed in the third via hole.

In an exemplary embodiment of the present disclosure, the barrier structure, the first planarization layer and the second planarization layer are disposed in a same layer with a same material.

In an exemplary embodiment of the present disclosure, the light-emitting panel further includes:

- a packaging structure, packaged on a side of the second electrode away from the base substrate.

In an exemplary embodiment of the present disclosure, the packaging structure includes:

- a first inorganic layer, disposed on the side of the second electrode away from the base substrate;
- an organic layer, disposed on a side of the first inorganic layer away from the base substrate; and
- a second inorganic layer, disposed on a side of the organic layer away from the base substrate and at a periphery of the barrier structure.

In an exemplary embodiment of the present disclosure, the light-emitting panel further includes:

- a first protective layer set, disposed on a side of the packaging structure away from the base substrate.

In an exemplary embodiment of the present disclosure, the protective layer set includes:

- a first adhesive layer, disposed on the side of the packaging structure away from the base substrate; and
- a first protective layer, disposed on a side of the first adhesive layer away from the base substrate.

In an exemplary embodiment of the present disclosure, the light-emitting panel further includes:

- a second protective layer set, disposed between the second surface and the magnetic conductive sheet.

In an exemplary embodiment of the present disclosure, the second protective layer set includes:

- a second adhesive layer, disposed on the second surface of the base substrate; and
- a second protective layer, disposed on a side of the second adhesive layer away from the base substrate.

In an exemplary embodiment of the present disclosure, a thickness of the conductive coil is less than or equal to 5 microns, and a number of turns of the conductive coil is greater than or equal to 3 turns.

According to one aspect of the present disclosure, a light-emitting device id provided, which includes any of the above light-emitting panel.

In an exemplary embodiment of the present disclosure, the light-emitting device further includes a card case, the card case includes a first card plate and a second card plate disposed oppositely, edges of the first card plate and the second card plate are connected, a through hole is provided on the first card plate, and the light-emitting panel is disposed in the through hole.

It is to be understood that both the foregoing general description and the following detailed description are exemplary and explanatory only and are not restrictive of the present disclosure.

BRIEF DESCRIPTION OF THE DRAWINGS

The accompanying drawings, which are incorporated in and constitute a part of this specification, illustrate embodiments consistent with the disclosure and together with the description, serve to explain the principles of the disclosure. Obviously, the drawings in the following description are only some embodiments of the present disclosure. For those of ordinary skill in the art, other drawings can be obtained based on these drawings without exerting creative efforts.

DETAILED DESCRIPTION

Figure 1:
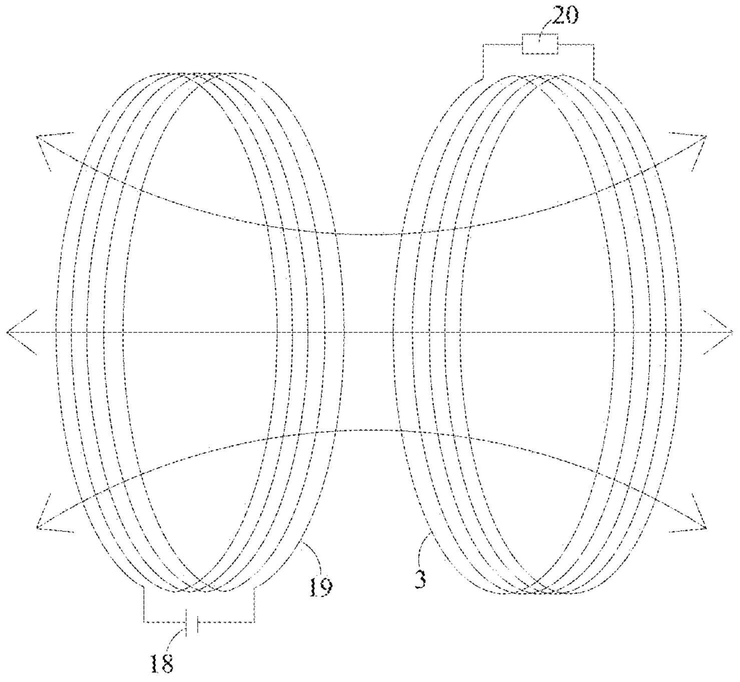
FIG. 1 is a schematic diagram of the electromagnetic induction principle of the coil.

Example embodiments will now be described more fully with reference to the accompanying drawings. Example embodiments may, however, be embodied in many forms and should not be construed as limited to the embodiments set forth herein; rather, these embodiments are provided so that this disclosure will be thorough and complete, and will fully convey the concept of example embodiments to those skilled in the art. The same reference numerals in the drawings denote the same or similar structures, and thus their detailed descriptions will be omitted. Furthermore, the drawings are merely schematic illustrations of the present disclosure and are not necessarily drawn to scale.

Although relative terms such as "upper" and "lower" are used in this specification to describe the relative relationship of one component illustrated in the figure to another component, these terms are used in this specification only for convenience, for example, according to the direction of the example shown in the accompanying drawings. It will be appreciated that if the illustrated device is turned over so that it is upside down, then elements described as being "upper" will become elements that are "lower". When a structure is "on" another structure, it may mean that a structure is integrally formed on another structure, or that a structure is "directly" placed on another structure, or that a structure is "indirectly" placed on another structure through another structure.

The terms "a", "an", "the", "said" and "at least one" are used to indicate the presence of one or more elements/components/etc.; the terms "include" and "have" are used to indicate an open-ended inclusive and mean that there may be additional elements/components/etc. in addition to those listed; the terms "first", "second", "third" etc. are only used as a marker, not a limit on the number of its objects.

Figure 2:
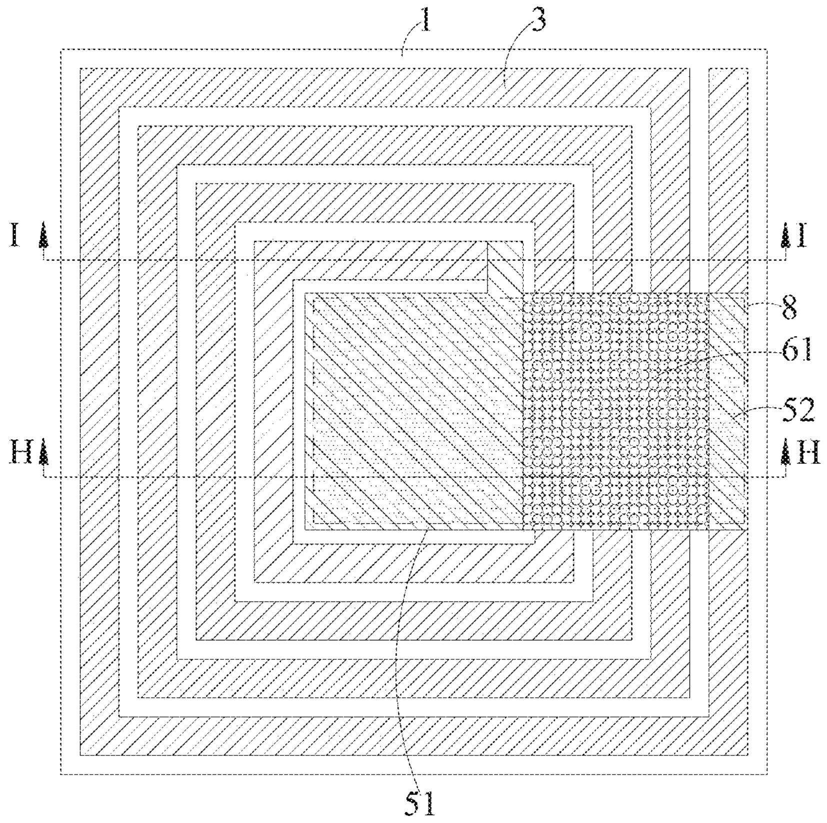
FIG. 2 is a schematic structural diagram of an exemplary embodiment of the light-emitting panel of the present disclosure.

The present disclosure provides a light-emitting panel. FIGS. 2 to 8 are schematic structural diagrams of the light-emitting panel of the present disclosure. In FIGS. 2 and 5, the conductive coil, the first electrode and the second electrode overlap each other. In order to clearly indicate their area range, they are marked with different line types. The light-emitting panel may include a base substrate 1, a conductive coil 3, a first electrode 51, a light-emitting layer 7 and a second electrode 8. The base substrate 1 has a first surface and a second surface disposed oppositely. The conductive coil 3 is provided on the first surface of the substrate 1, and the conductive coil 3 has a first end and a second end. The first electrode 51 is connected to the first end. The light-emitting layer 7 is disposed on the side of the first electrode 51 away from the base substrate 1. The second electrode 8 is disposed on the side of the light-emitting layer 7 away from the base substrate 1, and the second electrode 8 is connected to the second end.

In the light-emitting panel of the present disclosure, with reference to the coil electromagnetic induction principle diagram shown in FIG. 1, the conductive coil 3 will generate current when driven by the power transmission coil 19 of the wireless charging source or NFC (Near Field Communication) source. The wireless charging source or NFC is connected to the power supply 18. The current passes through the light-emitting structure 20 composed of the first electrode 51, the light-emitting layer 7 and the second electrode 8, thereby lighting the light-emitting layer 7 to achieve the light-emitting function, satisfying people's increasing demand for organic light-emitting diodes. Also, the conductive coil 3 and the wireless charging source or NFC are powered by wireless induction, so it is easy to use.

The base substrate 1 may be made of rigid insulating material or flexible insulating material. In this exemplary embodiment, the base substrate 1 can be an inorganic insulating layer 2, which can be a glass plate, quartz plate, metal plate or resin plate, for example, silicon nitride, silicon oxide; it can also be an organic insulating layer, for example, polyimide resin, polycarbonate, polyacrylate, polyetherimide, polyethersulfone, polyethylene terephthalate, polyethylene naphthalate and other resin materials. For example, the base substrate 1 may be formed of multiple material layers. For example, the base substrate 1 may include a base, and the material of the base may be composed of the above-mentioned materials.

Referring to FIG. 3, FIG. 4, FIG. 6 and FIG. 7, the base substrate 1 has a first surface and a second surface disposed oppositely. An inorganic insulating layer 2 may be disposed on the first surface, and the material of the inorganic insulating layer 2 may be silicon nitride, silicon oxide, etc. Of course, in other example embodiments of the present disclosure, the inorganic insulating layer 2 may not be provided.

A conductive coil 3 is disposed on the side of the inorganic insulating layer 2 away from the base substrate 1. The conductive coil 3 is made of materials such as Cu, Al, and Ag. The vertical distance between the surface of the conductive coil 3 away from the inorganic insulating layer 2 and the inorganic insulating layer 2 is less than or equal to 5 microns, that is, the thickness of the conductive coil 3 is less than or equal to 5 microns. The number of turns of the conductive coil 3 is greater than or equal to 3 turns. The width of the conductive coil 3 is greater than or equal to 0.05 mm and less than or equal to 3 mm. The inductance parameter of the conductive coil 3 is greater than 1 uh, and the resistance of the conductive coil 3 is less than 10 ohms. The conductive coil 3 has a first end and a second end. The first end is located at the inner side the conductive coil 3 and the second end is located at the outer side of the conductive coil 3. This facilitates the arrangement of the first electrode 51 and facilitates the connection between the second end and the second electrode 8. Of course, the second end can also be located at the inner side the conductive coil 3, and the first end can also be located at the outer side the conductive coil 3. The conductive coil 3 can be arranged in various shapes such as arc, rectangle, trapezoid, etc., as needed.

A first planarization layer 41 is provided on a side of the conductive coil 3 away from the base substrate 1. The material of the first planarization layer 41 is an organic insulating material. For example, PR (photoresist) glue materials. The first planarization layer 41 can play a planarizing role and provide a relatively flat base for the first electrode 51, the light-emitting layer 7 and the second electrode 8. Two via holes are provided on the first planarization layer 41, namely the first via hole 43 and the second via hole 44; wherein the first via hole 43 penetrates to the first end of the conductive coil 3, and the second via hole 44 penetrates to the second end of the conductive coil 3. Since the second end is located at the outer side of the conductive coil 3, the second via hole 44 can also be provided with a notch structure, that is, the second via hole 44 is formed as notch structure without part of the side wall.

While forming the first planarization layer 41, a first barrier layer 42 is also formed around the conductive coil 3. That is, the first planarization layer 41 and the first barrier layer 42 are formed through the same patterning process. The first barrier layer 42 surrounds the conductive coil 3. The first barrier layer 42 may be provided in various shapes such as arc, rectangle, trapezoid, etc., that are adapted to the conductive coil 3. A gap is provided between the first barrier layer 42 and the first planarization layer 41.

Figure 3:
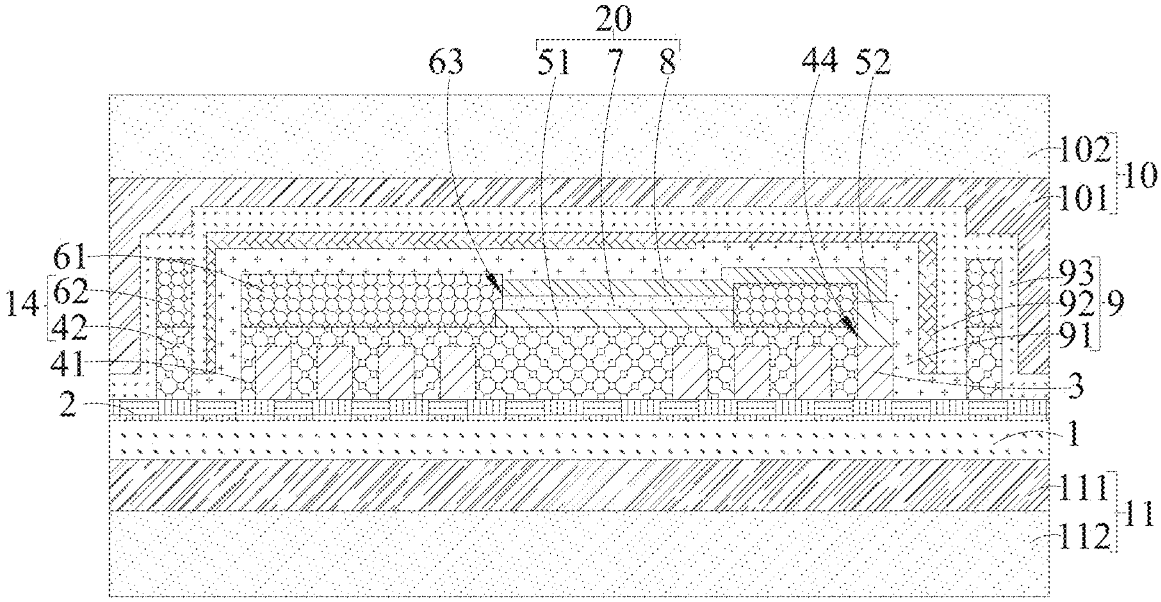
FIG. 3 is a schematic cross-sectional view taken along line H-H in FIG. 2.
Figure 5:
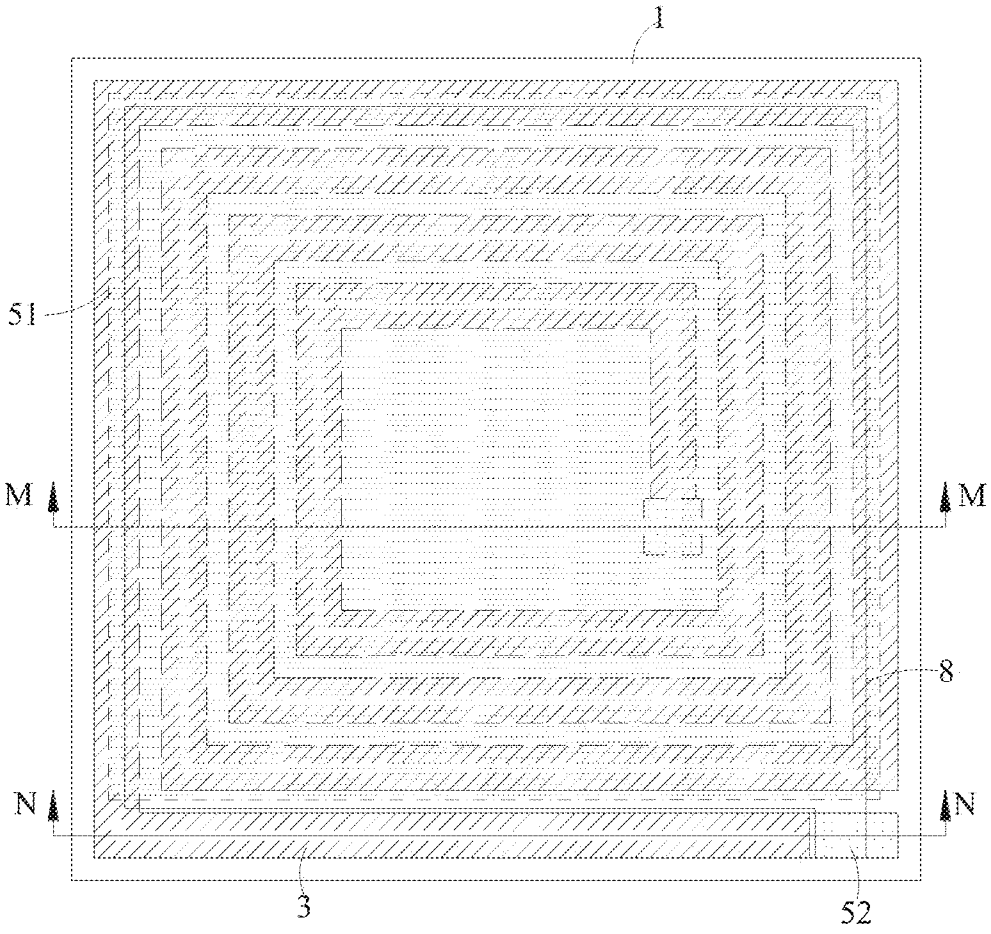
FIG. 5 is a schematic structural diagram of another exemplary embodiment of the light-emitting panel of the present disclosure.
Figure 6:
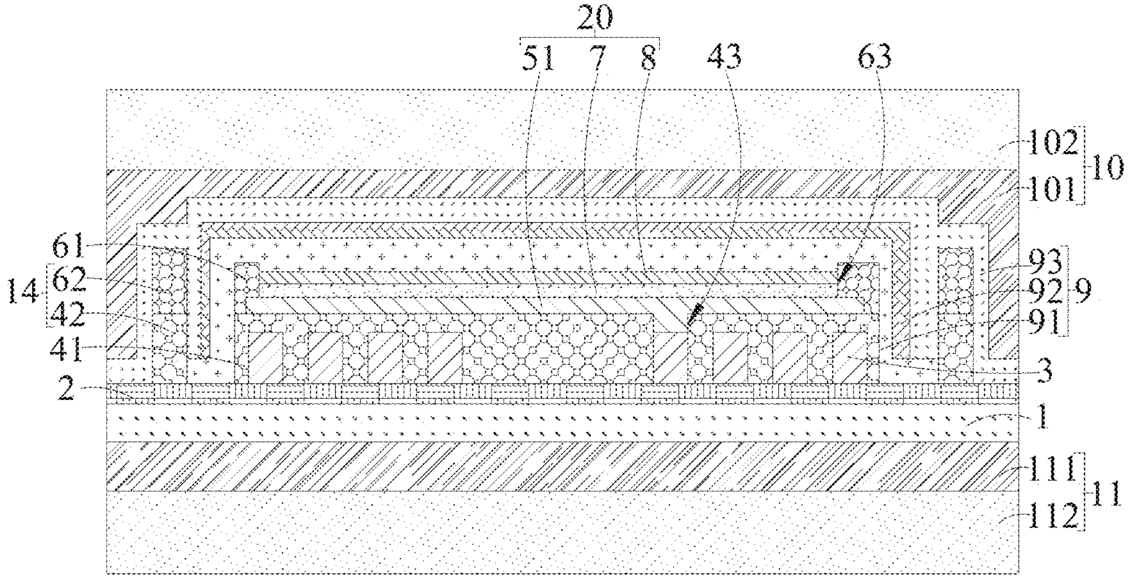
FIG. 6 is a schematic cross-sectional view taken along line M-M in FIG. 5.

A first electrode 51 and a connection electrode 52 are formed on a side of the first planarization layer 41 away from the base substrate 1. The first electrode 51 may be an anode. Referring to FIGS. 2 and 3, the orthographic projection of the first electrode 51 on the base substrate 1 may be located in the orthographic projection of the inner ring of the conductive coil 3 on the base substrate 1. The first electrode 51 is connected to the first end of the conductive coil 3 through the first via hole 43. Of course, in other example embodiments of the present disclosure, as shown in FIGS. 5 and 6, the orthographic projection of the first electrode 51 on the substrate 1 is located in the orthographic projection of the outer ring of the conductive coil 3 on the substrate 1, and the orthographic projection of the inner ring of the conductive coil 3 on the base substrate 1 is located within the orthographic projection of the first electrode 51 on the base substrate 1. In addition, in other example embodiments of the present disclosure, the orthographic projection of the outer ring of the conductive coil 3 on the base substrate 1 can also be located within the orthographic projection of the first electrode 51 on the base substrate 1, all of which belong to the technical protection scope of the present disclosure.

Referring to FIGS. 2, 3, 5, and 7, the connection electrode 52 is connected to the second end of the conductive coil 3 through the second via hole 44. The connection electrode 52 and the first electrode 51 are arranged in the same layer and made of the same material, that is, the connection electrode 52 and the first electrode 51 are formed through the same patterning process. The connection electrode 52 is spaced apart from the first electrode 51, that is, a gap is provided between the connection electrode 52 and the first electrode 51. The orthographic projection of the second via hole 44 on the base substrate 1 is overlapped with the orthographic projection of the connecting electrode 52 on the base substrate 1, or the orthographic projection of the second via hole 44 on the base substrate 1 is located in the orthographic projection of the connecting electrode 52 on the base substrate 1, such that the connection electrode 52 fills at least the second via hole 44.

It should be noted that the first end and the second end mentioned above are not necessarily the innermost end or the outermost end of the conductive coil 3. The part is the first end as long as it is close to the innermost end of the electric coil, and the part is the second end as long as it is close to the outermost end of the electric coil.

Figure 4:
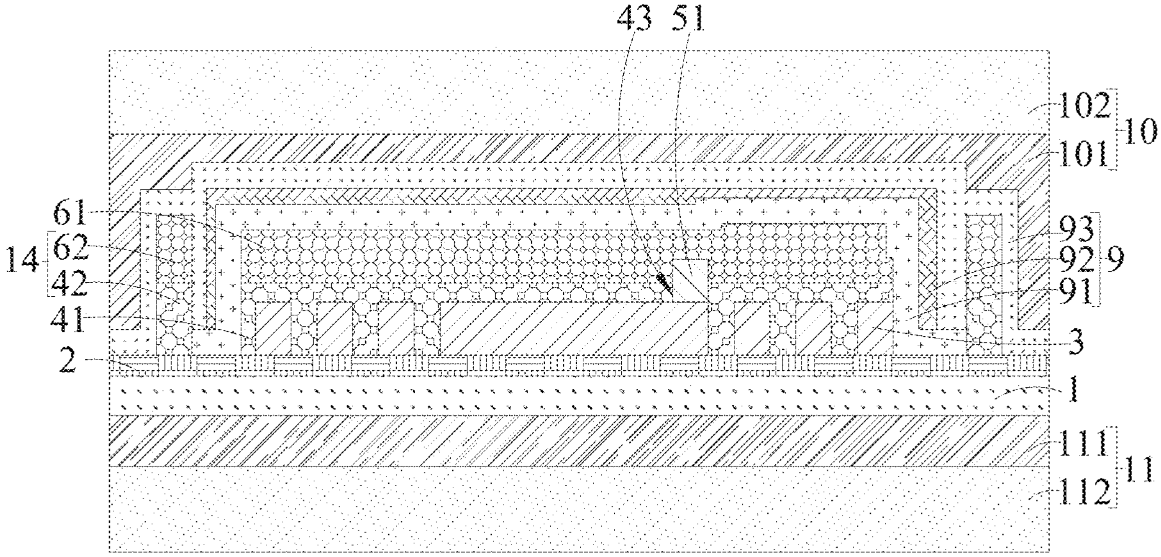
FIG. 4 is a schematic cross-sectional view taken along line I-I in FIG. 2.
Figure 7:
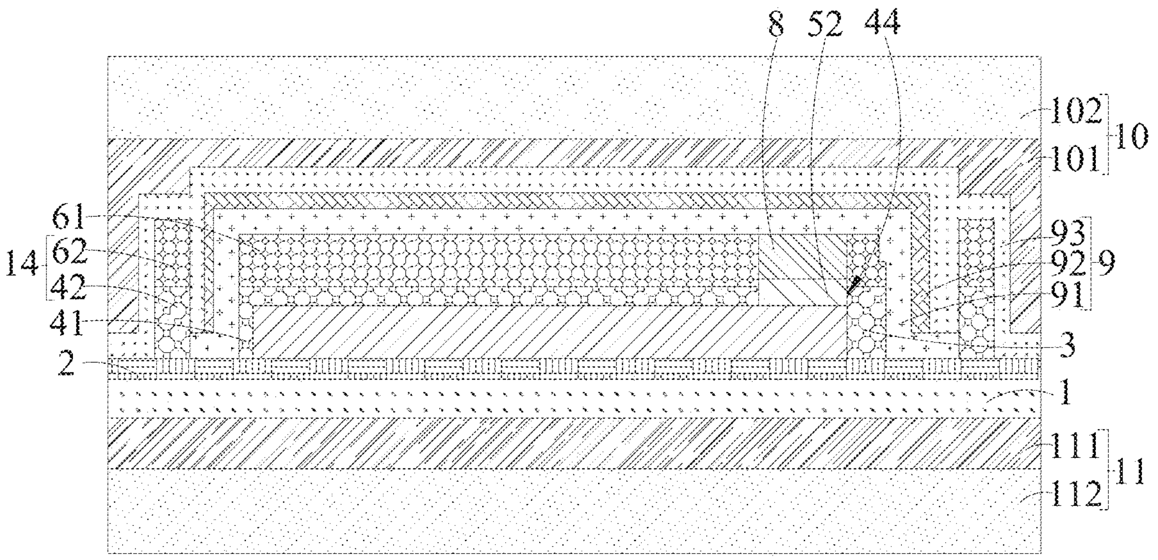
FIG. 7 is a schematic cross-sectional view taken along the line N-N in FIG. 5.

Referring to FIGS. 3 and 4, as well as FIGS. 6 and 7, a second planarization layer 61 is disposed on the sides of the first planarization layer 41 and the first electrode 51 away from the base substrate 1. The second planarization layer 61 is filled into the gap between the first electrode 51 and the connecting electrode 52 to further insulate the first electrode 51 and the connecting electrode 52. A third via hole 63 is provided on the second planarization layer 61, and the third via hole 63 penetrates to the first electrode 51 so that at least part of the first electrode 51 is exposed.

While forming the second planarization layer 61, a second barrier layer 62 is also formed around the conductive coil 3, that is, the second planarization layer 61 and the second barrier layer 62 are formed through the same patterning process. The second barrier layer 62 is disposed on the side of the first barrier layer 42 away from the base substrate 1. The first barrier layer 42 and the second barrier layer 62 encircle the conductive coil 3, the first electrode 51, the light-emitting layer 7 and the second electrode 8. The second barrier layer 62 can also be provided in various shapes such as arc, rectangle, trapezoid, etc., that are adapted to the conductive coil 3. A gap is provided between the second barrier layer 62 and the second planarization layer 61. A barrier structure 14 is formed by the first barrier layer 42 and second barrier layer 62. The vertical distance between the surface of the barrier structure 14 away from the base substrate 1 and the base substrate 1 is greater than or equal to the vertical distance between the surface of the second electrode 8 away from the base substrate 1 and the base substrate 1. The barrier structure 14 is not only used to block ink and limit the packaging boundary during the IJP (Ink-jet printing) of the packaging layer, but also extends the path for water vapor to enter the light-emitting area, thereby preventing water vapor from entering the light-emitting area, and improving the service life of the light-emitting panel.

Referring to FIG. 3 and FIG. 6, a light-emitting layer 7 is disposed on the side of the first electrode 51 away from the base substrate 1. The light-emitting layer 7 may include a hole injection layer, a hole transport layer, an organic light-emitting layer 7, an electron injection layer and an electron transport layer. When power is on, holes enter the device from the anode and pass through the hole injection layer and hole transport layer, and electrons enter the device from the cathode and pass through the electron injection layer and electron transport layer. The holes and the electrons finally reach the organic light-emitting layer 7. The holes and electrons meet in the light-emitting layer 7 and then recombine. When the electrons and holes recombine, they will generate energy and release photons. The color of the light is determined by the energy of the photons. High energy emits blue light, moderate energy emits green light, and low energy emits red light.

Referring to FIGS. 3 and 4, as well as FIGS. 6 and 7, a second electrode 8 is disposed on the side of the light-emitting layer 7 away from the base substrate 1, and the second electrode 8 may be the cathode. The second electrode 8 is connected to the connecting electrode 52 so that the second electrode 8 is connected to the second end of the conductive coil 3. The light-emitting structure 20 is formed by the first electrode 51, the light-emitting layer 7 and the second electrode 8.

In the example embodiment shown in FIGS. 2 to 7, the first electrodes 51 are disposed on the side of the conductive coil 3 away from the base substrate 1. The light-emitting panel shown in FIGS. 2 to 4 is different from the light-emitting panel shown in FIGS. 5 to 7 mainly in that the area size of the light-emitting structure 20. The light-emitting panels shown in FIGS. 2 to 4 emit light in the central area, while the light-emitting panels shown in FIGS. 5 to 7 emit light basically from the front surface.

It should be noted that when the first electrode 51 is provided on the side of the conductive coil 3 away from the base substrate 1, it can be configured not only as a central light-emitting structure and an entire surface light-emitting structure, but also as an eccentric light-emitting structure.

Figure 8:
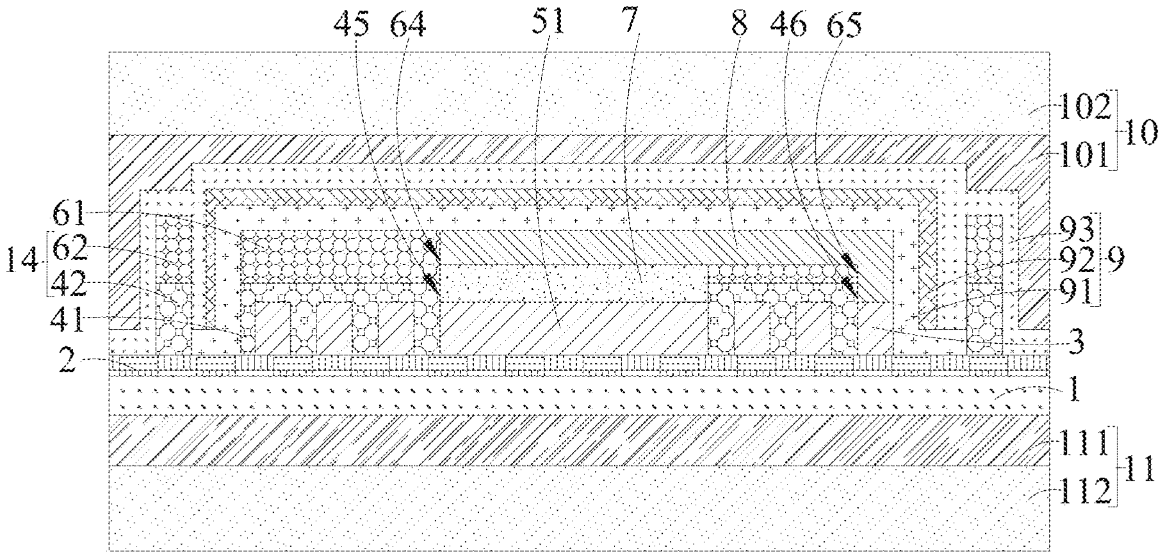
FIG. 8 is a schematic structural diagram of yet another exemplary embodiment of the light-emitting panel of the present disclosure.

Referring to FIG. 8, in other example embodiments of the present disclosure, the first electrode 51 can be provided in the same layer and with same material as the conductive coil 3, that is, the first electrode 51 and the conductive coil 3 are formed through the same patterning process. The first electrode 51 and the first end of the conductive coil 3 can be directly connected together. A first planarization layer 41 is provided on the sides of the first electrode 51 and the conductive coil 3 away from the base substrate 1. Two via holes are provided on the first planarization layer 41, namely the fifth via hole 45 and the sixth via hole 46. The fifth via hole 45 penetrates to the first electrode 51 to expose at least part of the first electrode 51. The sixth via hole 46 penetrates to the second end of the conductive coil 3 to expose the second end of the conductive coil 3. A second planarization layer 61 is provided on the side of the first planarization layer 41 away from the base substrate 1. Two via holes are also provided on the second planarization layer 61, namely the seventh via hole 64 and the eighth via hole 65. The seventh via hole 64 penetrates to the fifth via hole 45 on the first planarization layer 41, and the light-emitting layer 7 is disposed in the via hole. The eighth via hole 65 penetrates to the sixth via hole 46 on the first planarization layer 41, that is, penetrates to the second end of the conductive coil 3, so that the second end of the conductive coil 3 is exposed. The second electrode 8 is provided on the side of the light-emitting layer 7 away from the base substrate 1. The second electrode 8 is connected to the second end of the conductive coil 3 through the sixth via hole 46 on the first planarization layer 41 and the eighth via hole on the second planarization layer 61.

It should be noted that when the first electrode 51 and the conductive coil 3 are arranged in the same layer and made of the same material, they can be configured as a central light-emitting structure. Of course, they can also be configured as an eccentric light-emitting structure.

In addition, the shapes of the first electrode 51, the light-emitting layer 7 and the second electrode 8 are substantially the same. Their shapes can be configured to rectangles as shown in FIGS. 2 and 5, or to relative regular shapes such as circles, ovals, trapezoids, etc.; they can also be configured to a company's LOGO (LOGOtype, emblem or trademark) pattern, of course, can also be configured to patterns of various other shapes, which will not be exemplified one by one here. Referring to FIGS. 3, 4, 6, 7 and 8, a packaging structure 9 is provided on the sides of the second planarization layer 61 and the second electrode 8 away from the base substrate 1. The packaging structure 9 may include a first inorganic layer 91, an organic layer 92 and a second inorganic layer 93. The first inorganic layer 91 is provided on the sides of the second planarization layer 61 and the second electrode 8 away from the base substrate 1, and at the side surfaces of the first planarization layer 41 and the second planarization layer 61, that is, the first inorganic layer 91 also extends into the gap between the barrier structure 14 and the first planarization layer 41 and the second planarization layer 61. The first inorganic layer 91 covers all the light-emitting structure 20. The organic layer 92 is disposed on the side of the first inorganic layer 91 away from the base substrate 1. The second inorganic layer 93 is disposed on the side of the organic layer 92 away from the base substrate 1 and at the periphery of the barrier structure 14, that is, the second inorganic layer 92 covers both the light-emitting structure 20 and the barrier structure 14. The cooperation between the packaging structure 9 and the barrier structure 14 further prevents water vapor and the like from entering the light-emitting area, thereby improving the service life of the light-emitting panel.

In this example embodiment, a first protective layer set 10 is provided on a side of the packaging structure 9 away from the base substrate 1. The first protective layer set 10 may include a first adhesive layer 101 and a first protective layer 102. The first adhesive layer 101 is disposed on a side of the packaging structure 9 away from the base substrate 1. The first protective layer 102 is disposed on a side of the first adhesive layer 101 away from the base substrate 1. The first protective layer 102 is bonded to the side of the packaging structure 9 away from the base substrate 1 by the first adhesive layer 101. The material of the first protective layer 102 can be a polarizing cover plate with Hard Coating (surface hardening), a CPI (transparent polyimide) film material, or a simple PET (polyethylene terephthalate) material with Hard Coating treatment. Of course, the structure of the first protective layer set 10 is not limited to the above description. For example, the first protective layer set 10 may include only one layer, or may include more layers. The first protective layer set 10 can protect the first surface of the light-emitting panel and improve the service life of the light-emitting panel.

A second protective layer set 11 is provided on the second surface of the base substrate 1. The second protective layer set 11 may include a second adhesive layer 111 and a second protective layer 112. The second adhesive layer 111 is disposed on the second surface of the base substrate 1. The second protective layer 112 is disposed on the side of the second adhesive layer 111 away from the base substrate 1, and the second protective layer 112 is bonded to the second surface of the base substrate 1 by the second adhesive layer 111. The material of the second protective layer 112 may be PET. Of course, the structure of the second protective layer set 11 is not limited to the above description. For example, the second protective layer set 11 may include only one layer, or may include more layers. The second protective layer set 11 can protect the second surface of the light-emitting panel and improve the service life of the light-emitting panel.

Figure 9:
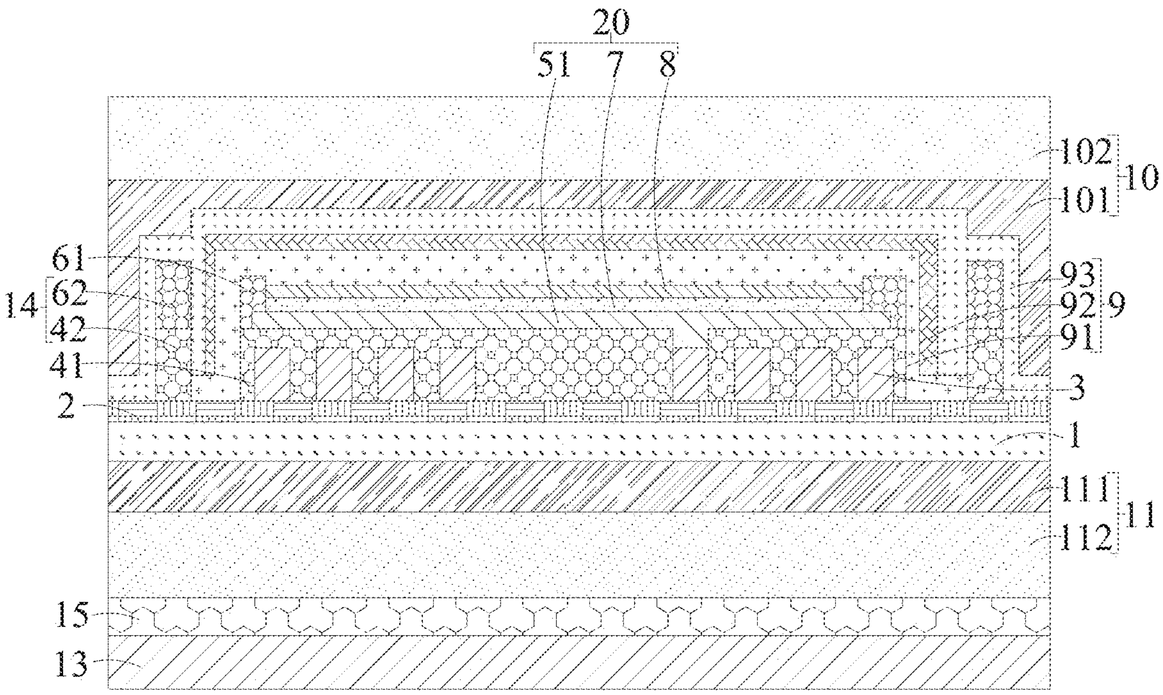
FIG. 9 is a schematic structural diagram of yet another exemplary embodiment of the light-emitting panel of the present disclosure.

Referring to FIG. 9, in other exemplary embodiments of the present disclosure, a magnetic conductive sheet 13 is provided on the side of the second protective layer 112 away from the base substrate 1, and the magnetic conductive sheet 13 is bonded to the side of the second protective layer 112 away from the base substrate 1 by an adhesive layer 15. The magnetic conductive sheet 13 plays a role in absorbing magnetic fields. The magnetic conductive sheet 13 can increase the magnetic field received by the conductive coil 3 and increase the current and voltage in the conductive coil 3, thereby increasing the luminous brightness of the light-emitting structure 20 and reducing energy consumption. The material of the magnetic sheet 13 can be ferrite, amorphous nanocrystalline magnetic material, etc., and the magnetic permeability of the magnetic sheet 13 can be greater than 150 (the magnetic permeability here is the relative magnetic permeability, which is a dimensionless number relative to the vacuum magnetic permeability: the value represented is the real part of the complex magnetic permeability, which is the magnetic permeability), and the magnetic loss is less than 100 (the imaginary part of the complex magnetic permeability represents the magnetic loss).

Furthermore, embodiments of the present disclosure also provide a light-emitting device, which may include any of the light-emitting panels described above. The specific structure of the light-emitting panel has been described in detail above, and therefore will not be described again here.

Figure 10:
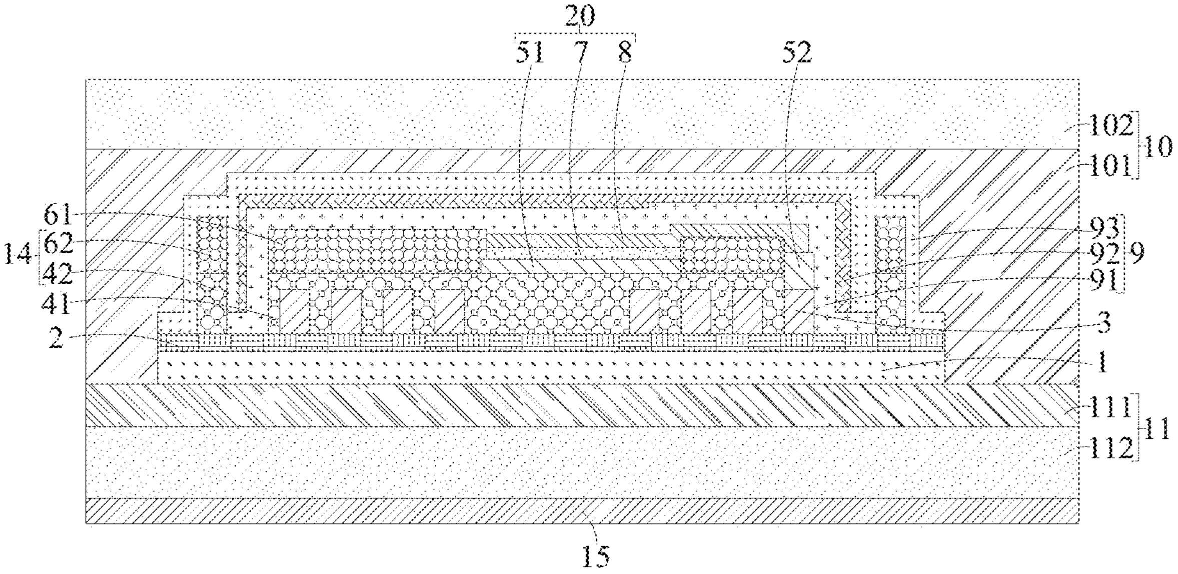
FIG. 10 is a schematic structural diagram of an exemplary embodiment of the light-emitting device of the present disclosure.

Referring to FIG. 10, the light-emitting device may be a light-emitting film tape. The light-emitting film tape includes the above-mentioned light-emitting panel. The area of the first protective layer set 10 and the second protective layer set 11 can be set relative larger to facilitate attachment. The film tape also includes an adhesive layer, which is disposed on the non-luminous side, for example, on the side close to the second surface of the base substrate 1, and the luminescent panel is flexible. The adhesive layer enables the luminescent film tape to have an attachment function and can be attached and shaped according to the shape of the attached object. It can be understood that multiple luminescent panels can be arranged on one luminescent film strip.

Figure 11:
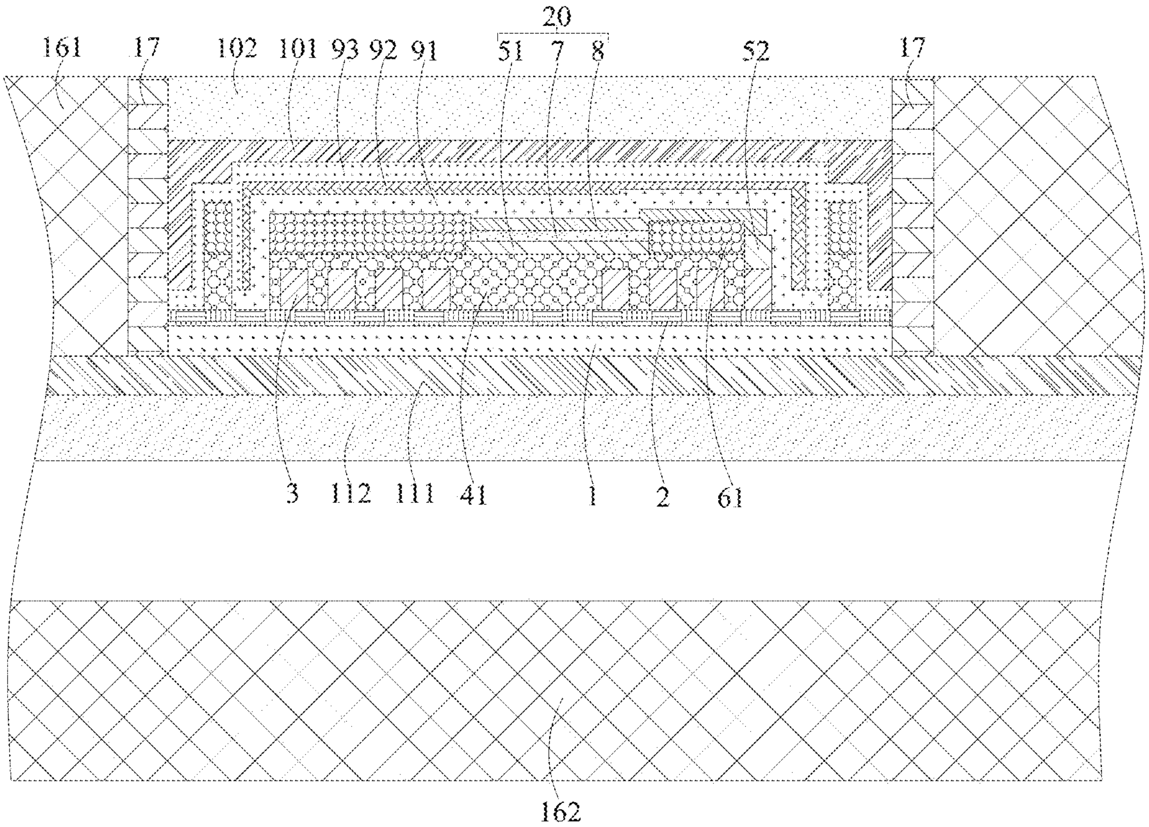
FIG. 11 is a schematic structural diagram of another exemplary embodiment of the light-emitting device of the present disclosure.

Referring to FIG. 11, the light-emitting device can also be a card case. The card case can include a first card plate 161 and a second card plate 162. The first card plate 161 and the second card plate 162 are disposed oppositely and are partially connected at the edges. The unconnected area forms a card insertion opening. A through hole is provided on the first card plate 161, and the light-emitting panel is installed in the through hole through a sealant 17. The second adhesive layer 111 can be disposed on the side of the first card plate 161 close to the second card plate 162, and the second protective layer 112 can be bonded on the side of the second adhesive layer 111 away from the first card plate 161. The second adhesive layer 111 and the second protective layer 112 may cover the entire side of the first card plate 161 close to the second card plate 162, or may only cover part of the side. Disposing the second adhesive layer 111 and the second protective layer 112 outside the through hole can improve the connection firmness between the light-emitting panel and the first card plate 161. Of course, a groove can also be provided on the first card plate 161, and the light-emitting panel can be fixedly installed in the groove: the light-emitting panel can also be directly attached to the first card plate 161 without providing a groove or a through hole. It can be understood that multiple light-emitting panels can be provided on one card case: multiple light-emitting panels can be provided on the same card board or on different card boards.

Required pattern may be formed, by transfer, printing, laser engraving, hot stamping and other processes, on the non-light-emitting area of the first protective layer 102 or the side of the first card plate 161 away from the second card plate 162, to increase the aesthetic effect.

Of course, the specific type and structure of the light-emitting device are not limited to the above description. Those skilled in the art can make corresponding selections according to the specific use of the light-emitting device, which will not be described again here.

Compared with the prior art, the beneficial effects of the light-emitting device provided by the exemplary embodiments of the present disclosure are the same as the beneficial effects of the light-emitting panel provided by the above-mentioned exemplary embodiments, and will not be described again here.

Other embodiments of the disclosure will be readily apparent to those skilled in the art from consideration of the specification and practice of the disclosure herein. This application is intended to cover any variations, uses, or adaptations of the disclosure that follow the general principles of the disclosure and include common knowledge or general technical means in the technical field that are not disclosed in the disclosure. It is intended that the specification and examples be considered as exemplary only, with a true scope and spirit of the disclosure being indicated by the following claims.

What is claimed is:

1. A light-emitting panel, comprising:

a base substrate having a first surface and a second surface disposed oppositely;

a conductive coil disposed on the first surface of the base substrate, the conductive coil having a first end and a second end;

a first electrode connected to the first end;

a light-emitting layer disposed on a side of the first electrode away from the base substrate; and a second electrode disposed on a side of the light-emitting layer away from the base substrate, and the second electrode being connected to the second end, wherein the light-emitting panel further comprises:

a connecting electrode, disposed in a same layer with a same material as the first electrode, and insulated from the first electrode, wherein the second electrode is connected to the second end through the connecting electrode.

2. The light-emitting panel according to claim 1, wherein the first electrode is disposed on a side of the conductive coil away from the base substrate, or the first electrode is disposed in a same layer with a same material as the conductive coil.

3. The light-emitting panel according to claim 1, wherein the light-emitting panel further comprises:

a magnetic conductive sheet, disposed on the second surface of the base substrate.

4. The light-emitting panel according to claim 3, wherein the light-emitting panel further comprises:

a second protective layer set, disposed between the second surface and the magnetic conductive sheet.

5. The light-emitting panel according to claim 4, wherein the second protective layer set comprises:

a second adhesive layer, disposed on the second surface of the base substrate; and a second protective layer, disposed on a side of the second adhesive layer away from the base substrate.

6. The light-emitting panel according to claim 1, wherein the light-emitting panel further comprises:

a barrier structure, disposed around a periphery of the conductive coil, and a vertical distance between a surface of the barrier structure away from the base substrate and the base substrate is greater than or equal to a vertical distance between a surface of the second electrode away from the base substrate and the base substrate.

7. The light-emitting panel according to claim 6, wherein the light-emitting panel further comprises:

a first planarization layer, disposed between the conductive coil and the first electrode; and a second planarization layer, disposed on sides of the first planarization layer and the first electrode away from the base substrate, wherein a third via hole is disposed on the second planarization layer, the third via hole is penetrated to the first electrode, and the light-emitting layer and the second electrode are disposed in the third via hole.

8. The light-emitting panel according to claim 7, wherein the barrier structure, the first planarization layer and the second planarization layer are disposed in a same layer with a same material.

9. The light-emitting panel according to claim 6, wherein the light-emitting panel further comprises:

a packaging structure, packaged on a side of the second electrode away from the base substrate.

10. The light-emitting panel according to claim 9, wherein the packaging structure comprises:

a first inorganic layer, disposed on the side of the second electrode away from the base substrate;

an organic layer, disposed on a side of the first inorganic layer away from the base substrate; and a second inorganic layer, disposed on a side of the organic layer away from the base substrate and at a periphery of the barrier structure.

11. The light-emitting panel according to claim 9, wherein the light-emitting panel further comprises:

a first protective layer set, disposed on a side of the packaging structure away from the base substrate.

12. The light-emitting panel according to claim 11, wherein the first protective layer set comprises:

a first adhesive layer, disposed on the side of the packaging structure away from the base substrate; and a first protective layer, disposed on a side of the first adhesive layer away from the base substrate.

13. The light-emitting panel according to claim 1, wherein a thickness of the conductive coil is less than or equal to 5 microns, and a number of turns of the conductive coil is greater than or equal to 3 turns.

14. A light-emitting device, comprising a light-emitting panel, wherein the light-emitting panel comprises:

a base substrate having a first surface and a second surface disposed oppositely;

a conductive coil disposed on the first surface of the base substrate, the conductive coil having a first end and a second end;

a first electrode connected to the first end;

a light-emitting layer disposed on a side of the first electrode away from the base substrate; and a second electrode disposed on a side of the light-emitting layer away from the base substrate, and the second electrode being connected to the second end, wherein the light-emitting panel further comprises:

a connecting electrode, disposed in a same layer with a same material as the first electrode, and insulated from the first electrode, wherein the second electrode is connected to the second end through the connecting electrode.

15. The light-emitting device according to claim 14, wherein the light-emitting device further comprises a card case, the card case comprises a first card plate and a second card plate disposed oppositely, edges of the first card plate and the second card plate are connected, a through hole is provided on the first card plate, and the light-emitting panel is disposed in the through hole.

16. The light-emitting device according to claim 14, wherein the first electrode is disposed on a side of the conductive coil away from the base substrate, or the first electrode is disposed in a same layer with a same material as the conductive coil.

17. The light-emitting device according to claim 14, wherein the light-emitting panel further comprises:

a magnetic conductive sheet, disposed on the second surface of the base substrate.

18. The light-emitting device according to claim 14, wherein the light-emitting panel further comprises:

a barrier structure, disposed around a periphery of the conductive coil, and a vertical distance between a surface of the barrier structure away from the base substrate and the base substrate is greater than or equal to a vertical distance between a surface of the second electrode away from the base substrate and the base substrate.

* * * * *